(12) United States Patent
Choudhury et al.

(10) Patent No.: US 8,527,920 B1
(45) Date of Patent: Sep. 3, 2013

(54) AUTOMATED SYNTHESIS OF HIGH-PERFORMANCE TWO OPERAND BINARY PARALLEL PREFIX ADDER

(71) Applicant: International Business Machines Corporation, Armonk, NY (US)

(72) Inventors: Mihir Choudhury, New York, NY (US);
Ruchir Puri, Baldwin Place, NY (US);
Subhendu Roy, Austin, TX (US);
Sharad C. Sundararajan, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/752,934

(22) Filed: Jan. 29, 2013

Related U.S. Application Data

(63) Continuation of application No. 13/686,624, filed on Nov. 27, 2012.

(51) Int. Cl.
*G06F 17/50* (2006.01)

(52) U.S. Cl.
USPC ........................................................ 716/104

(58) Field of Classification Search
USPC ........................................................ 716/104
See application file for complete search history.

(56) References Cited

PUBLICATIONS

Brent, R., et al. "A Regular Layout for Parallel Adders" IEEE Transactions on Computers, vol. 31, No. 3. Mar. 1982. pp. 1-9.
Choi, Y., et al. "Parallel Prefix Adder Design With Matrix Representation" 17th IEEE Symposium on Computer Arithmetic (ARITH-17 2005). Jun. 2005. (9 Pages).
Han, T., et al. "Fast Area-Efficient VLSI Adders" 8th IEEE Symposium on Computer Arithmetic (ARITH 1987). May 1987. pp. 49-56.
Harris, D. "A Taxonomy of Parallel Prefix Networks" Asilomar Conference on Signals, Systems & Computers—ASILOMAR, Nov. 2003. pp. 2213-2217.
Knowles, S. "A Family of Adders" 14th IEEE Symposium on Computer Arithmetic (Arith-14 '99). Apr. 1999. (8 Pages).
Kogge, P., et al. "A Parallel Algorithm for the Efficient Solution of a General Class of Recurrence Equations" IEEE Transactions on Computers, vol. C-22, No. 8. Aug. 1973. pp. 786-793.
Ladner, R., et al. "Parallel Prefix Computation" Journal of the Association for Computing Machinery, vol. 27, No. 4. Oct. 1980. pp. 831-838.
Liu, J., et al. "An Algorithmic Approach for Generic Parallel Adders" International Conference on Computer Aided Design (ICCAD '03). Nov. 2003. pp. 734-740.
Liu, J., et al. "Optimum Prefix Adders in a Comprehensive Area, Timing and Power Design Space" Proceedings of the 12th Conference on Asia South Pacific Design Automation (ASP-DAC 2007). Jan. 2007. pp. 609-615.

(Continued)

*Primary Examiner* — Vuthe Siek
*Assistant Examiner* — Mohammed Alam
(74) *Attorney, Agent, or Firm* — Tutunjian & Bitetto, P.C.; Preston J. Young

(57) ABSTRACT

A method for automated synthesis of a parallel prefix device includes determining structural constraints for a given parallel prefix device; generating a plurality of candidate prefix graphs for the parallel prefix device by performing a search of possible prefix graphs meeting the constraints; performing physical synthesis of each of the plurality of candidate prefix graphs to generate performance information for each candidate prefix graph; and determining one or more of the plurality of candidate prefix graphs that meet performance criteria for incorporation into the parallel prefix device.

24 Claims, 10 Drawing Sheets

(56) References Cited

PUBLICATIONS

Matsunaga, T., et al. "Area Minimization Algorithm for Parallel Prefix Adders Under Bitwise Delay Constraints" (GLSVLSI '07). Mar. 2007. pp. 435-440.

Sklansky, J. "Conditional-Sum Addition Logic" IRE Transactions on Electronic Computers. Jun. 1960. pp. 226-231.

Zhou, C., et al. "64-Bit Prefix Adders: Power-Efficient Topologies and Design Solutions" IEEE Custom Integrated Circuits Conference (CICC 2009). Sep. 2009. pp. 1-5.

Zhu, H., et al. "Constructing Zero-Deficiency Parallel Prefix Adder of Minimum Depth" Proceedings of the 2005 Conference on Asia South Pacific Design Automation (ASP-DAC 2005). Jan. 2005. pp. 883-888.

Ziegler, M., et al. "A Unified Design Space for Regular Parallel Prefix Adders" Proceedings of the Design, Automation and Test in Europe Conference and Exhibition (DATE '04). Feb. 2004. (2 Pages).

Zimmermann, R. "Binary Adder Architectures for Cell-Based VLSI and Their Synthesis" Dissertation for Doctor of technical sciences: Swiss Federal Institute of Technology. 1997. pp. i-205.

Zimmermann, R. "Non-Heuristic Optimization and Synthesis of Parallel-Prefix Adders" Proc. Int. Workshop on Logic and Architecture Synthesis (IWLAS'96). Dec. 1996. pp. 123-132.

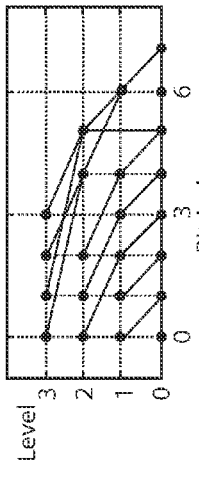

FIG. 8A
Bit Width = 8
Total Area = 12, Max. Level = 3, Max. Fanout = 4
Total WireL = 49, Max. WireL = 5
Total Paths = 46, Total PathL = 71
Max. Path FO = 744, Total Path FO = 979

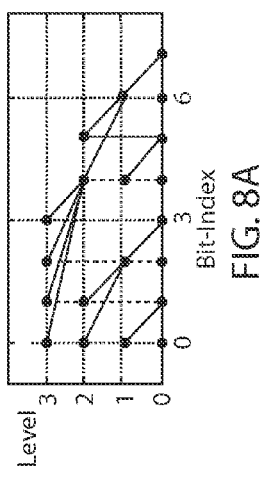

FIG. 8B
Bit Width = 8
Total Area = 15, Max. Level = 3, Max. Fanout = 3
Total WireL = 62, Max. WireL = 6
Total Paths = 41, Total PathL = 71
Max. Path FO = 108, Total Path FO = 370

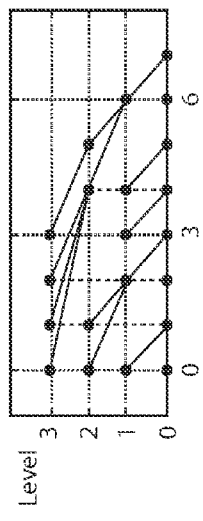

FIG. 8C
Bit Width = 8
Total Area = 14, Max. Level = 3, Max. Fanout = 3
Total WireL = 58, Max. WireL = 6
Total Paths = 42, Total PathL = 71
Max. Path FO = 348, Total Path FO = 547

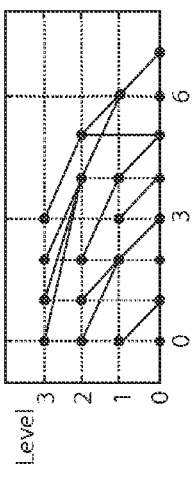

FIG. 8D
Bit Width = 8
Total Area = 13, Max. Level = 3, Max. Fanout = 3
Total WireL = 52, Max. WireL = 5
Total Paths = 45, Total PathL = 70
Max. Path FO = 522, Total Path FO = 727

Bit Width = 8
Total Area = 12, Max. Level = 3, Max. Fanout = 4
Total WireL = 49, Max. WireL = 5
Total Paths = 46, Total PathL = 71
Max. Path FO = 744, Total Path FO = 979

Bit Width = 8
Total Area = 13, Max. Level = 3, Max. Fanout = 3
Total WireL = 54, Max. WireL = 5
Total Paths = 43, Total PathL = 71
Max. Path FO = 638, Total Path FO = 853

AUTOMATED SYNTHESIS OF HIGH-PERFORMANCE TWO OPERAND BINARY PARALLEL PREFIX ADDER

RELATED APPLICATION INFORMATION

This application is a Continuation application of co-pending U.S. patent application Ser. No. 13/686,624 filed on Nov. 27, 2012, incorporated herein by reference in its entirety.

BACKGROUND

1. Technical Field

The present invention relates to binary adders, and more particularly to adders configured to optimize performance in designing and implementing logic for two operand binary addition in high-performance microprocessor systems based upon algorithms for adjusting parallel prefix graphs.

2. Description of the Related Art

Binary addition may be formulated as a parallel prefix problem. Inputs of the binary addition may include two operands, denoted as a and b, which are n-bit binary numbers. Outputs of the binary addition are two n-bit binary numbers s (sum) and c (carry). For a, b, s, and c, bit 0 is the least significant bit (LSB), and bit n−1 is the most significant bit (MSB).

Two n-bit intermediate signals carry propagate $p_i = a_i * b_i$ and carry generate $g_i = a_i + b_1$ are used to formulate binary addition as a parallel prefix problem. The prefix operation may be defined as follows: $G_{i:k} + P_{i:k} G_{k-1:j} = G_{i:j}$; $P_{i:k} P_{k-1:j} = P_{i:j}$; where $i \geq k > j$, $P_{i:i} = p_i$ and $G_{i:i} = g_i$.

There are a number of solutions that address the parallel prefix problem. In many instances, these attempts do not offer flexibility to recover from poor decisions or provide a comprehensive solution stack (to explore several optimal solutions). Some drawbacks of known solutions include failure to provide a proposed solution for modifying the prefix graph to improve performance later in a tool flow when accurate timing information becomes available. In addition, posing the problem as a dynamic program requires constraining the prefix graph structure and significantly reduces the space of prefix graphs that can be explored by such an approach. For example, this approach cannot find a feasible solution when constraints on both logic levels on outputs and maximum fanout per node are specified.

Solving the problem with gate-sizing, buffering, and structured placement for a prefix structure using an Integer Linear Program (ILP) approach uses an abstract model for timing, area and power with no mention of choosing different prefix graph logic structures to improve the quality of the solution. A hierarchical scheme to improve sparsity of the prefix graph by rebalancing of fanout and wiring is specialized to a 64-bit adder and requires designer knowledge of gate/wire delays in a technology to converge to a good hierarchical solution. Methods that generate a continuum of hybrid prefix structures across the three dimensions of sparsity, fanout and radix do not provide a methodology that permits selecting a structure based on physical and technology constraints.

In summary, none of the existing solutions provide a plug-and-play infrastructure to address sub-optimalities introduced in a prefix graph structure due to abstract physical models that are employed to generate the prefix graphs. A new solution is needed to address abstract physical model inaccuracies, especially in deep sub-micron technologies. As a result of these inaccuracies, a synthesized design either does not meet timing requirements in high performance designs or consumes too much power when timing deficiencies, due to a poor choice of prefix structure, are compensated later in a flow using circuit parameters such as gate-sizing, threshold voltage optimization, supply voltage scaling, etc.

SUMMARY

A method for automated synthesis of a parallel prefix device includes determining structural constraints for the parallel prefix device; generating a plurality of candidate prefix graphs for the parallel prefix device by performing a search of possible prefix graphs meeting the constraints; performing physical synthesis of each of the plurality of candidate prefix graphs to generate performance information for each candidate prefix graph; and determining one or more of the plurality of candidate prefix graphs that meet performance criteria for incorporation into the parallel prefix device.

Another method for automated synthesis of a two operand binary parallel prefix adder includes determining structural constraints for a given adder device input from a computer storage media; generating a plurality of candidate prefix graphs for the adder device by performing a search of possible prefix graphs meeting the constraints by generating a set of n-bit prefix graph solutions, P(i), where i is a counter, from each graph in P(n−1) using a recursive method until i=n is reached; performing physical synthesis of each of the plurality of candidate prefix graphs to generate performance information for each candidate prefix graph; determining one or more of the plurality of candidate prefix graphs that meet performance criteria for incorporation into the adder device; and if the performance criteria is not met, modifying a prefix graph structure to improve the performance.

The methods may be implemented using a computer readable storage medium comprising a computer readable program for automated synthesis of a parallel prefix device, wherein the computer readable program when executed on a computer causes the computer to perform the method steps.

A parallel prefix device includes summing logic gates; and a parallel prefix circuit configured to determine carry bits. The prefix circuit is selected in accordance with a prefix graph. The prefix graph includes nodes and connections having a configuration selected by generating a plurality of candidate prefix graphs for the parallel prefix circuit by performing a search of possible prefix graphs meeting structural constraints and performing physical synthesis of each of the plurality of candidate prefix graphs to generate performance information for each candidate prefix graph such that a best performing candidate prefix graph that meets performance criteria is incorporated into the parallel prefix device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIGS. 8A-8D show illustrative candidate prefix graphs output from Algorithm 1 in accordance with one illustrative embodiment;

DETAILED DESCRIPTION OF PREFERRED EMBODIMENTS

Figure 1:
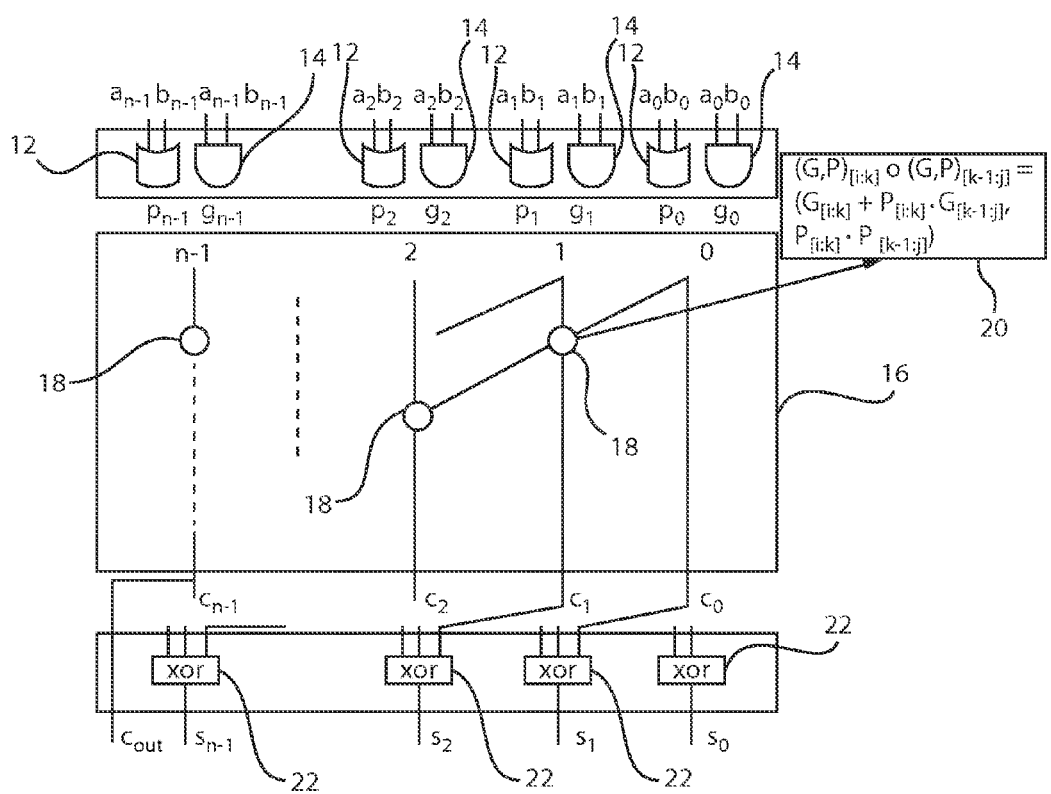
FIG. 1 is a schematic view of a binary adder in accordance with the present principles.

In accordance with the present principles, systems, devices and methods are provided for optimization of prefix structures for use in binary adders. While the focus of the present disclosure is on adders, it should be understood that similar techniques may be applied to other digital operations and devices. In addition, the present principles will be described with respect to parallel prefix graph structures. The most area-delay efficient adder architectures are realized through parallel prefix graph structures to synthesize high-performance adders. Given a bit-width and logic level constraint, existing algorithms generate a single prefix graph to minimize the number of prefix nodes with no flexibility in constraining the parameters like fanout or wire length distribution that impact performance/area of the design. An inductive approach, that generates all prefix graphs of bit-width n+1 given a parallel prefix graph of bit-width n in accordance with the present principles, addresses this issue by enumerating a large set of potential optimum prefix graphs, which provides a choice to control the graph's parameters. Due to the exponentially increasing search space with the number of bits, the complexity of this exhaustive approach is very high. However, the search can be scaled to 64 bits and even higher with competent implementation strategies, compact data-structure and efficient search space reduction techniques without affecting the solution quality. Experimental results demonstrate that the present exhaustive approach provides 9% or more improvement in area and 7-10% improvement in timing than a 64 bit full custom designed adder.

Binary addition is the most fundamental one among various arithmetic operations. Adders may be designed in two ways: custom designs and automated synthesis. Custom designs could achieve higher levels of optimization in terms of performance due to detailed gate-level descriptions, but are expensive and the turnaround time (TAT) is high. However, these fixed structures are limited and not flexible to keep up with different contexts like non-uniform bitwise input arrival times. Alternatively, several algorithms have been proposed to generate parallel prefix adders attempting to minimize the number of prefix nodes or size of the prefix graph(s) under a given bit-width (N) and logic level (L) constraints. These techniques are not optimal for prefix graphs with fewer levels than logN, which are more relevant for high performance adders. These techniques, which employ dynamic programming (DP) on a restricted search space, and then apply an area heuristic algorithm on the seed solution obtained by DP, are most effective in minimizing the size of the prefix graphs. However, the quality of the area-heuristic solution depends on the selection of seed solution from DP, which is not unique. Also, these algorithms do not have the flexibility in constraining parameters like fanout or wire length distribution that impact the area/performance of the design after placement.

The exhaustive approach for high performance adders is provided in accordance with the present principles. As the solution space is enormous, the present approach focuses on generating a large set of optimum prefix graphs where parameters like fanout can be controlled. In this approach, prefix graph structures are constructed in bit-wise bottom-up fashion, i.e., n+1 bit prefix graphs are built from n bit prefix graphs. One difficulty lies in the scalability due to its exhaustive nature, but with compact data structure, efficient implementation techniques, like lazy copy, etc., and search space reduction strategies like level-restriction, dynamic size pruning, repeatability pruning, etc., the present approach is able to be scaled to 64 bits and even higher.

Compared to other existing methods, the present approach has at least the following advantages. The present approach is the most efficient in minimizing the size of the prefix graph for given bit-width (n) and log(n) logic level constraints. This is equally effective for non-uniform bitwise level constraints as well. The present approach provides the flexibility to tune parameters like fanout which could impact the design performance. The present approach may generate a set of optimum prefix graph structures at the logic synthesis level, which, in turn, gives a designer a choice to select a high performance adder based on its post-placement timing/area.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture on a substrate or wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip, such as an adder or including an adder, may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a binary adder 10 is illustratively depicted for adding two numbers a and b. The numbers a and b added using corresponding place values of bits in the binary form of the number. It should be understood that while binary forms are illustratively described other bases may be employed in accordance with the present principles. The bits of a and b (e.g., $a_0$, $b_0$, $a_1$, $b_1$, etc.) are logically combined by logic gates 12, 14, which produce results p (propagate) and g (generate) bits (e.g., $p_0$, $g_0$, $p_1$, $g_1$, etc.), which propagate a carry or generate a carry, respectively. A parallel prefix structure 16 represents how these carry bits are handle throughout the operation. The parallel prefix 16 includes wires connecting logic gate at nodes 18, where results are logically combined. In hardware, the parallel prefix 16 is implemented in wires (metallizations) and logic (timing issues), occupies area on a chip or device and consumes power. Given the parallel prefix 16 can have a large number of variations; these and other parameters need to be optimized for best performance. In general, the parallel prefix 16 performs block 20 (see EQ. 6 below) at each node 18. The parallel prefix 16 outputs carry bits c (e.g., $c_0$, $c_1$, $c_2$, etc.), which are XOR'd 22 with the inputs to provide a sum bit (e.g., $s_0$, $s_1$, $s_2$, etc.) and a $c_{out}$ bit.

Figure 2:
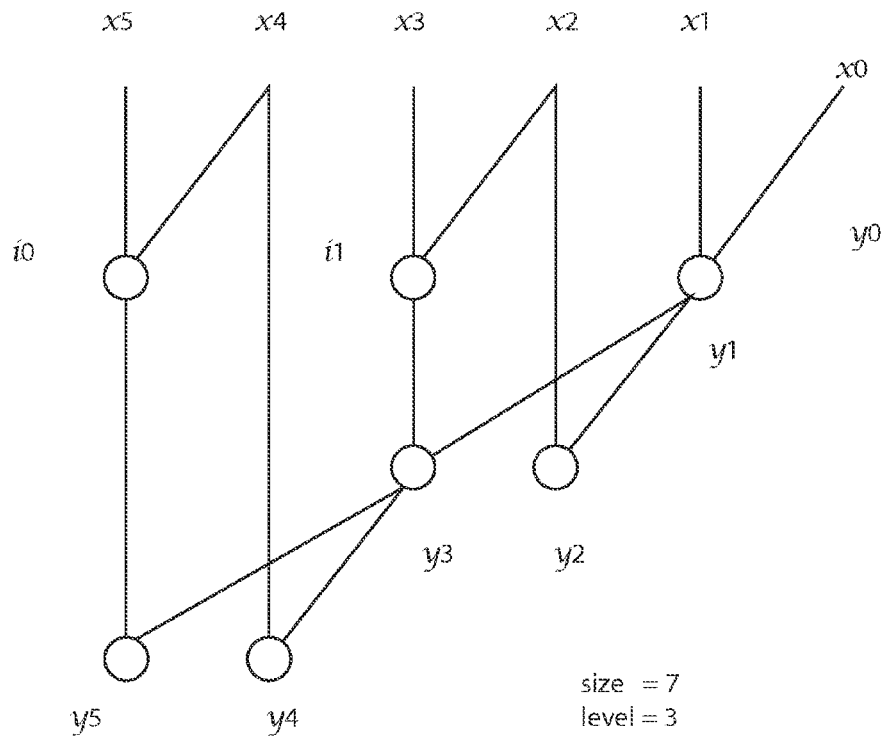
FIG. 2 is an illustrative prefix graph for demonstrating concepts in accordance with the present principles.

Referring to FIG. 2, a prefix graph 24 is shown in accordance with the present principles to demonstrate some of the concepts for designing and implementing an adder. The prefix graph 24 represents a parallel prefix (16) to be implemented in hardware. In this example, prefix graph 24 includes a size of 7 and a level of 3. Given ordered n inputs $x_0$, $x_1$, $x_{n-1}$ and an associative operation, o, prefix computation of n outputs is defined as follows:

$$y_i = x_i o x_{i-1} o \ldots o x_o \forall i \in [0, n-1] \quad (1)$$

where the i-th output depends on all previous inputs $x_j (j \leq i)$.

A prefix graph of width n is a directed acyclic graph (with n inputs/outputs) whose nodes correspond to the associative operation o in the prefix computation, and there exists an edge from node $v_i$ node $v_j$ if $v_i$ is an operand of $v_2$.

The prefix graph 24 is illustratively a 6 bit graph. In this example, we can write $y_5$ as $$y_5 = i_1 o\ y_3 = (x_5 o\ x_4) o (i_0 o\ y_1) \quad (2)$$
$$= (x_5 o\ x_4) o ((x_3 o\ x_2) o (x_1 o\ x_0))$$

Next, the prefix graph 10 will be described in the context of binary addition.

A binary addition problem is defined as follows. Given an n-bit augend and $a_{n-1} \ldots a_1 a_0$ and an n-bit addend $b_{n-1} \ldots b_1 b_0$, compute the sum $s_{n-1} \ldots s_1 s_0$ and carry $c_{n-1} \ldots c_1 c_0$, where $$s_i = a_i \oplus b_i \oplus c_{i-1}$$
$$c_i = a_i b_i + a_i c_{i-1} + b_i c_{i-1} \quad (3)$$

With bitwise (group) generate function g (G) and propagate function p (P), n bit binary addition can be mapped to a prefix computation problem as follows:

Pre-processing: Bitwise g, p generation $$g_i = a_i \cdot b_i$$
$$p_i = a_i \oplus b_i \quad (4)$$

Prefix-processing: The concept of generate/propagate is extended to multiple bits, and $G_{[i:j]}$, $P_{[i:j]}$ ($i \geq j$) are defined as:

$$P_{[i:j]} = \begin{cases} p_i & \text{if } i = j \\ p_{[i:k]} \cdot P_{[k-1:j]} & \text{otherwise} \end{cases} \quad (5)$$

$$G_{[i:j]} = \begin{cases} g_i & \text{if } i = j \\ G_{[i:k]} + P_{[i:k]} G_{[k-1:j]} & \text{otherwise} \end{cases}$$

The computation for (G, P) is expressed in terms of associative operation o as:

$$(G, P)_{[i:j]} = (G, P)_{[i:k]} o (G, P)_{[k-1:j]} \quad (6)$$
$$= (G_{[i:k]} + P_{[i:k]} \cdot G_{[k-1:j]}, P_{[i:k]} \cdot P_{[k-1:j]})$$

Post-processing: Sum generation $$s_i = p_i \oplus c_{i-1}$$
$$c_i = G_{[i:0]} \quad (7)$$

Among the three components of the binary addition problem, both pre-processing and post-processing parts are fixed structures. However, o being an associative operator, provides the flexibility of grouping the sequence of operations in a pre-fix processing part and executing them in parallel. So the structure of the prefix graph determines the extent of parallelism.

At the technology independent level, size of the prefix graphs (# of prefix nodes) gives an area measure and logic level of the nodes roughly estimates timing. It should be noted that the actual timing depends on other parameters as well like fanout distribution and size of the prefix graph (the smaller the size, the greater the flexibility during post-synthesis gate sizing). The arrival level (AL) and required level (RL) of a node v in a prefix graph is defined as follows:

$$AL(v) = \max\{AL(v'), v' \in FI(v)\} + 1$$

$$RL(v) = \min\{RL(v'), v' \in FO(v)\} - 1 \quad (8)$$

where FI(v), FO(v) respectively denote the fan-in nodes and fan-out nodes of v.

Methods in accordance with the present approach increase the search space. Let $G_n$ denote the set of all possible prefix graphs with bit width n. Then, the size of $G_n$ grows exponentially with n and is given by catalan(n−1)*catalan(n−2)* . . . catalan(1), where $$catalan(n) = \frac{1}{n+1}\binom{2n}{n}.$$

For example, $|G_8|=332972640$, $|G_{12}|=2.29*10^{24}$. As the search space is large, compact data structures, efficient memory management and search space reduction techniques are employed to scale this approach.

Figure 3:
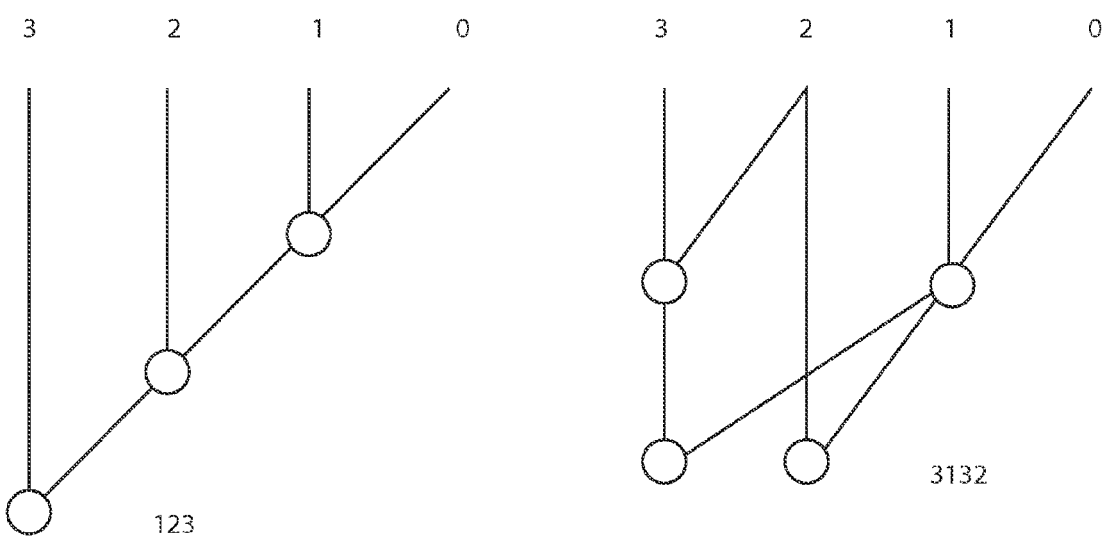
FIG. 3 shows prefix graphs for illustrating compact notation in accordance with the present principles.

Referring to FIG. 3, compact notation and data structures are described with reference to two prefix graphs 25 and 30. The present prefix graphs 25, 30 may be represented by a sequence of indices, e.g., "123" and "3132", respectively. Each prefix node is represented by an index (0, 1, 2, 3, . . . ), which is the most significant bit (MSB) of the node. The sequence is determined in topological order from left to right. For each index i in a given sequence, a node is added which is derived from 2 nodes, the first one is LastNode(i) and the second one is LastNode (lowerBound (LastNode(i))−1). Here LastNode (i) represents the node at highest logic level with index i in the existing prefix graph and the least significant bit (LSB) of a node N is indicated by lowerBound (N). The mapping from a sequence of indices to the prefix graph is many-to-one. For example, '3132' and '3123' will be represented by the same graph. However, the present methods ensure that sequences of the second kind will never be generated.

Apart from storing the index, parameters like LSB, level, fanout, etc. for each node in the prefix graph, are tracked. This information may be stored in a single integer, and a prefix graph may be represented by a list/sequence of integers. In one application, adders of 64 bits will be illustratively described, although other sizes are contemplated. Here, 7 bits are reserved for index, LSB, fanout and 4 bits for level, and are able to keep all this information for a node in a single integer as shown in Table 1. In this example, levels above 15 will not be employed, for simplicity, so 4 bits are sufficient to store level information. There are 7 extra bits to accommodate for adders of higher bit-width/level.

TABLE 1

| Bit Slicing | | | | |
|---|---|---|---|---|
| 7 | 7 | 7 | 4 | 7 |
| Extra | LSB | Fanout | Level | Index(MSB) |

This compact data structure helps in reducing memory usage and reducing run time as well. This is because, when a sequence needs to be copied for storing a solution, less copying activity is needed as compared to when all parameters need to be stored in individual integers.

Figure 4:
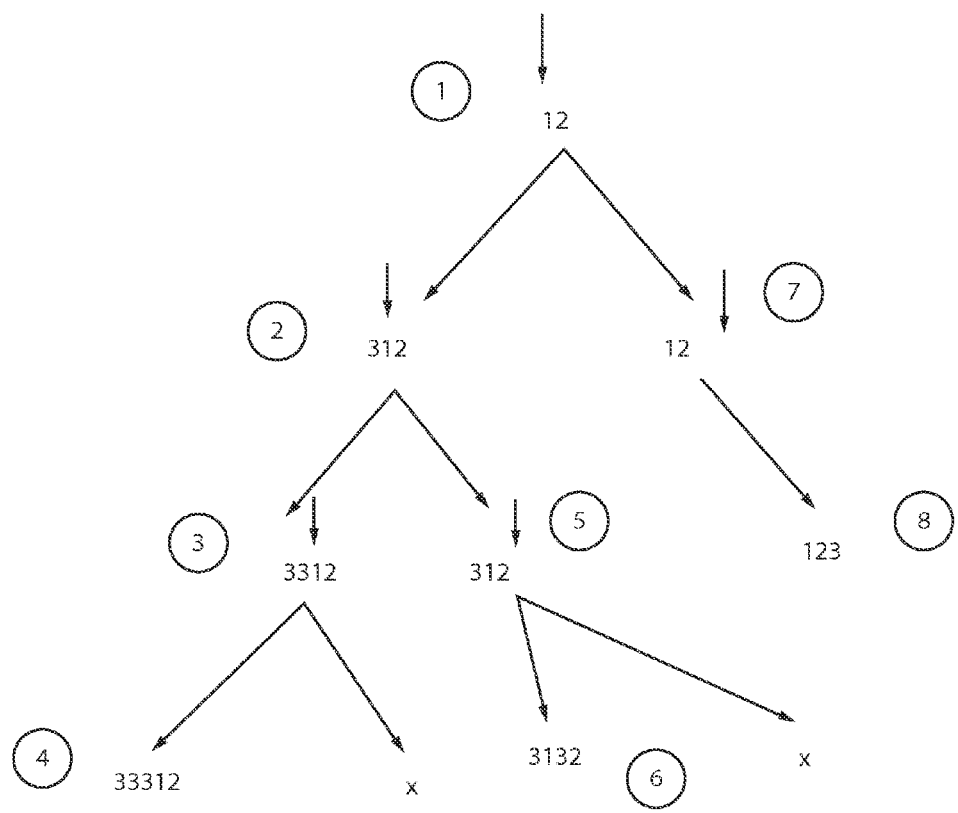
FIG. 4 shows a recursion tree to demonstrate construction of a prefix graph for higher bits in accordance with the present principles.

Referring to FIG. 4, a recursion tree 50 shows a bottom-up approach for an exhaustive search algorithm. A prefix graph of 2 bits (represented by a single index sequence (circled 1) is provided. The prefix graph structures are constructed for higher bits in an inductive way, i.e., given all possible prefix graphs ($G_n$) for n bits, all possible prefix graphs ($G_{n+1}$) of n+1 bits are constructed. The process of generating such graphs of n+1 bits from an element of $G_n$ by inserting n at appropriate positions is a recursive procedure. An element '12' shows this recursive procedure with the help of the recursion tree 50.

At the beginning of this recursive procedure (RP), we have a sequence '12' with an arrow on circled 1. The vertical arrows point to the index before which 3 can be inserted. At any stage (circled numbers 1-8), there are two options, either insert 3 and call RP, or move the arrow to a suitable position and then call RP. This position is found by iterating the list/sequence in the forward direction until searchIndex is found, where searchIndex=lowerBound(LastNode(3))−1. The left subtree denotes the first option and the right subtree indicates the second option. So the procedure either inserts '3' at the beginning of '12' and goes to the left or it goes to the right subtree by moving the arrow to the appropriate position. We can see that, searchIndex=lowerBound(LastNode(3))−1=3−1=2 for this case. Similarly, this procedure either inserts '3' or shifts the pointer after the '1' for the sequence '312', because the searchIndex has become 2−1=1. The traversal is done in pre-order, and this recursion is continued until lowerBound(LastNode(3)) becomes '0' or alternatively, a 4 bit prefix graph is constructed.

The right subtree of a node is not traversed if a prefix graph for bit 4 has been constructed at the left child of the node. For example, we do not traverse the right subtree of '3312' and '312'. Algorithm 1 (described below) illustrates the steps of the exhaustive approach. The algorithm preserves the uniqueness of the solutions by inserting the indices at the appropriate position.

Figure 5:
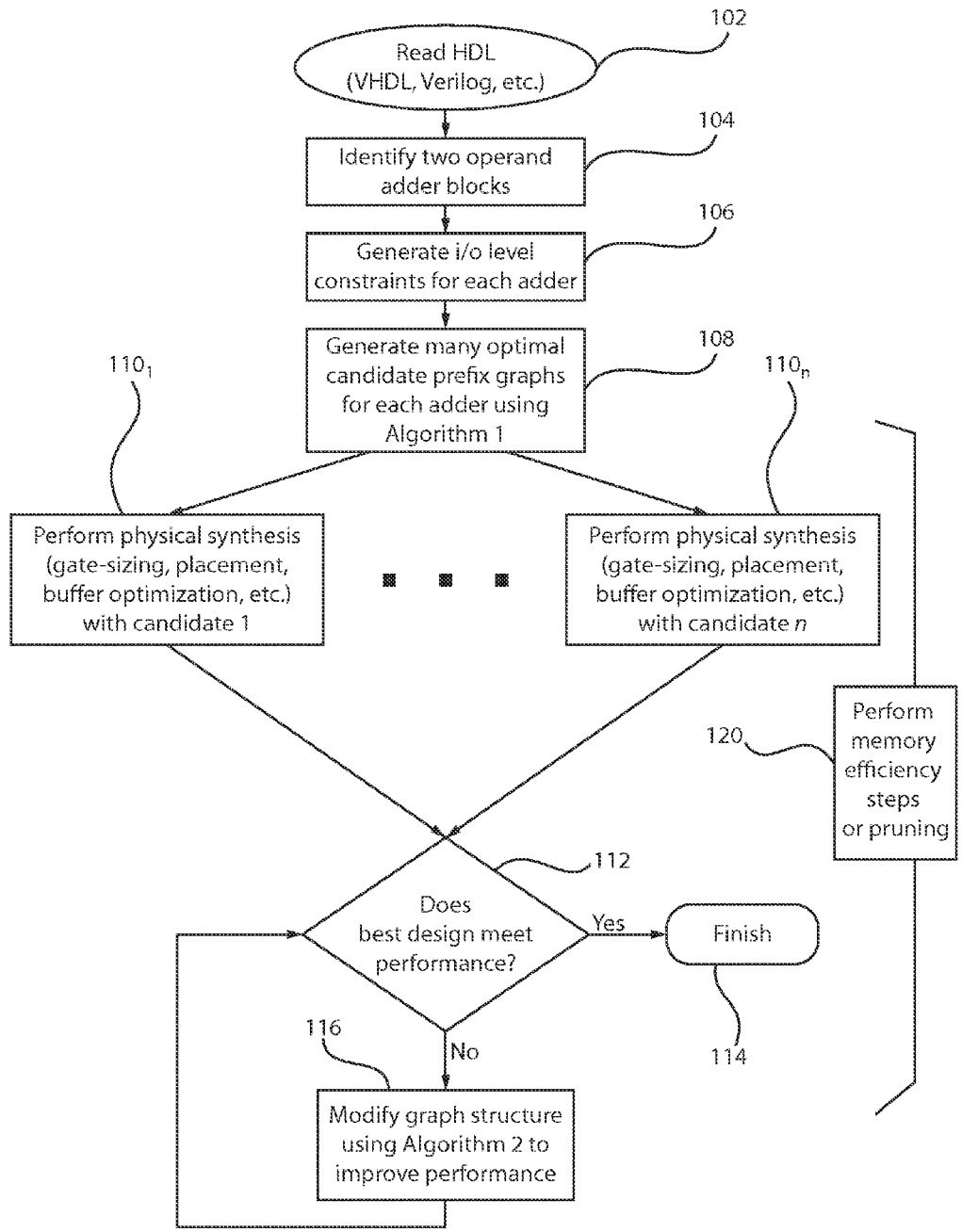
FIG. 5 is a block/flow diagram showing a system/method for determining a prefix graph and modifying its performance in accordance with one illustrative embodiment.

Referring to FIG. 5, a block/flow diagram shows a system/method for designing and/or implementing an adder in accordance with one illustrative embodiment. In block 102, a design is input for evaluation of its structure (e.g., adders). This may be performed using computer design tools and specifications, e.g., hardware description language (HDL), very-high-speed integrated circuits HDL (VHDL), Verilog, etc. for a particular semiconductor design. In block 104, two operand adder blocks are identified in the design, which can be analyzed/optimized in accordance with the present principles. In block 106, generate the input/output (i/o) level constraints for each adder. These may include timing constraints, number of inputs/outputs, etc.

In block 108, a plurality of optimal candidate prefix graphs are generated using Algorithm 1. Algorithm 1 generates multiple optimal prefix graphs to minimize objective function parameters, such as prefix graph size, wire tracks, etc. with specified constraints such as input arrival time, output required time, maximum fanout per node, etc.

Algorithm 1 provides greater flexibility in the number and types of prefix graph constraints, which leads to a better quality solution. Multiple "best" solutions are generated, and the candidate prefix graphs are generated based on the constraints such as logic levels, maximum fanout per node, etc. rather than approximate abstract models for timing, power, area, etc.

In blocks $110_1$-$110_n$, physical synthesis is performed for each candidate prefix graph (candidate 1-candidate n). This may be performed by digital modeling using computer software simulations or using actual hardware in prototype or experimental studies. The best candidate may be chosen based on accurate timing values, etc. after the physical synthesis. In block 112, a determination is made as to whether the best design(s) meet performance criteria set for the adder device. If the criteria are met, the method ends in block 114. Otherwise, the prefix graph structure is modified using Algorithm 2 to improve performance in block 116.

Algorithm 2 performs "surgical" modifications to prefix graph structures to ensure fast outputs are not disturbed (while removing negative slack paths). These modifications are provided based upon the physical timing analysis rather than abstract models. Algorithm 2 combines prefix graph restructuring with circuit optimization (e.g., gate-sizing, buffering, component placement, etc.). This reduces power consumption, among other benefits, in the resulting design.

In block 120, memory and runtime efficiency steps are taken throughout the method to conserve on memory and provide improved performance. All information for a prefix node may be stored (LSB, MSB, fanout, logic level) in a single bit-packed integer. A lazy copy may be employed. For recursive functions to generate graphs in P(i) from graphs in P(i−1), a new memory (integer list) only may be allocated when a feasible prefix graph is found for P(i). Until then, the same integer list may be modified to explore the space of possible prefix graphs. This reduces peak memory and saves significant runtime for a list copy. Repeatability pruning may be employed. Repeatability is a number of maximum numbers of consecutive occurrences of an integer in the list. For instance, repeatability of {33312} is 3. Integer sequences with repeatability >1 give prefix graphs with bad performance-power trade-off and hence, can be discarded. Other memory and efficiency methods may also be employed.

Figure 6:
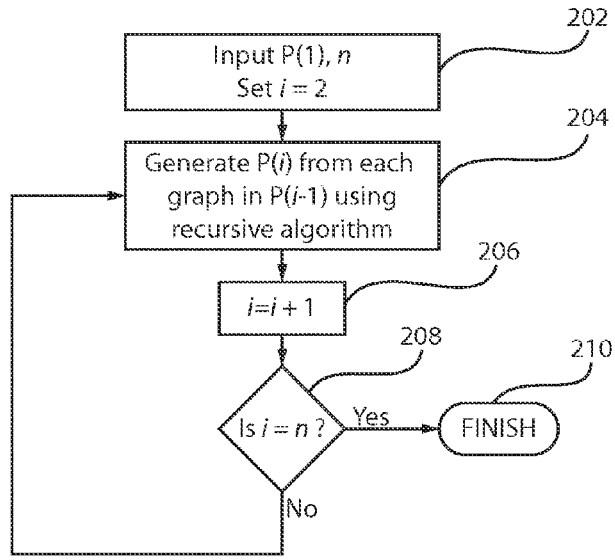
FIG. 6 is a block/flow diagram showing a system/method for executing Algorithm 1 in accordance with one illustrative embodiment.

Referring to FIG. 6, overall flow of Algorithm 1 is shown. Prefix graphs may be represented as a list of integers, e.g.: 1) Node i:j (≧j) has bit i as MSB and bit j as LSB; 2) Each node has one integer in the list (=MSB of the node); 3) Nodes are listed in topographical order (nodes with higher MSB first); 4) Notation: P(n) is a set of n-bit prefix graph solutions.

In block 202, input a first set of graphs P(1) and n. Initially, set a counter i=2. In block 204, generate P(i) from each graph in P(i−1) using a recursive algorithm (e.g., use the recursive tree method described in FIG. 4 or other search method that generates graphs that satisfy the constraints). Constraints and an objective function are employed in the generating of candidate prefix graphs. As prefix graphs are being generated, only those graphs that satisfy a specified constraint should be stored to reduce the memory space. For example, if a logic level constraint for each output bit is specified, then prefix graphs that violate this constraint for any output bit are not stored. The prefix graphs in P(n) may be stored in a hash table based on the value of the objective function. For example, if the objective is to minimize the size (number of prefix nodes in the graph), the prefix graph solutions would be hashed based on size and stored in increasing order of size. Hence, when P(n) is generated from prefix graphs in P(n−1), the most optimal prefix graphs from P(n−1) will be processed first. Note that due to the nature of the problem and depending on the constraints, a non-optimal prefix graph from P(n−1) may yield an optimal prefix graph in P(n).

In block 206, the counter is indexed (i=i+1). In block 208, a determination is made as to whether i=n. If yes, then end in block 210. Otherwise, return to block 204.

At the beginning of this recursive procedure (buildRecursive in Algorithm 1 below), we have a sequence '12' with an arrow on circled 1 (see FIG. 4). The arrow points to the index before which bit 3 can be inserted. At any stage (circled numbers 1-8 in FIG. 4), there are two options, either insert 3 (step 12 in Algorithm 1 of Table 2) and call buildRecursive (step 13 in Algorithm 1 of Table 2), or move the arrow to the next insertion position (steps 18-21 in Algorithm 1) and then call buildRecursive (step 22 in Algorithm 1 of Table 2). This next insertion position is found by iterating the list/sequence in the forward direction until searchIndex is found (steps 18-21 in Algorithm 1 of Table 2), where searchIndex=lowerBound(LastNode(3))−1 (step 11 in Algorithm 1 of Table 2). The left subtree of '12' in FIG. 4 denotes the first option and the right subtree of '12' in FIG. 4 indicates the second option. So the procedure either inserts '3' at the beginning of '12' and goes to the left sub-tree or it moves the arrow to the next insertion position (after 2) and goes to the right subtree. We can see that, searchIndex=lowerBound(LastNode(3))−1=3−1=2 for this case. Similarly, this procedure either inserts '3' or shifts the pointer after the '1' for the sequence '312', because the searchIndex has become 2−1=1. The traversal is done in pre-order, and this recursion is continued until lowerBound(LastNode(3)) becomes '0' i.e., a valid 4 bit prefix graph is constructed (steps 7-10 in Algorithm 1 of Table 2).

The right subtree of a node is not traversed if a valid 4-bit prefix graph has been found at the left child of the node. For example, we do not traverse the right subtree of '3312' and '312'. Algorithm 1 (described below) illustrates the steps of the exhaustive approach. The algorithm preserves the uniqueness of the solutions by inserting the indices at the appropriate position.

TABLE 2

Pseudocode for Algorithm 1:

Algorithm 1 Exhaustive Approach

```
 1:    //Given G_n construct G_{n+1}.
 2:    for all e ∈ G_n do
 3:        buildRecursive(e, e.begin, n);
 4:    end for
 5:    Procedure buildRecursive(nodeList, pointer, index)
 6:        node = LastNode(index);
 7:        if lowerBound(node) = 0 then
 8:            storeSolution;
 9:            return true;
10:        end if
11:        searchIndex ← lowerBound(node) − 1;
12:        newNode ← insertN(index, pointer, nodeList);
13:        flag ← buildRecursive(nodeList, pointer, index);
14:        if flag = true then
15:            return false;
16:        end if
17:        deleteN(newNode);
18:        repeat
19:            index ← getIndex(pointer);
20:            pointer ← pointer + 1;
21:        until index ≠ searchIndex and pointer ≠ nodeList.end
22:        buildRecursive(nodeList, pointer, index);
23:    end Procedure
```

Figure 7:
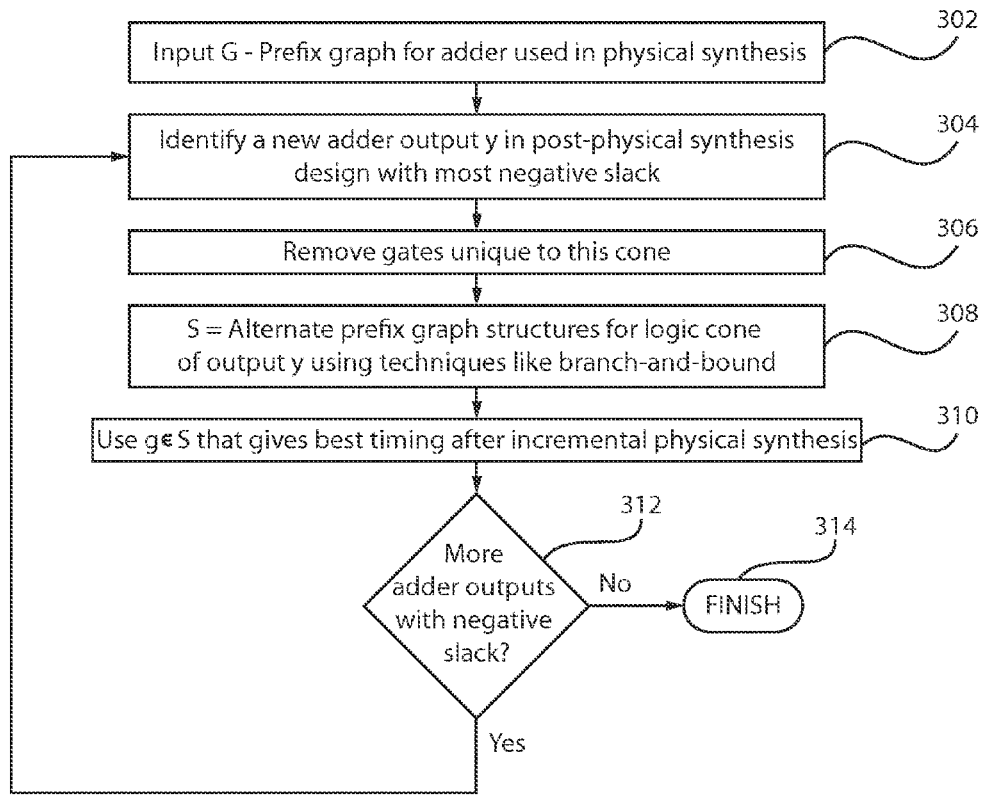
FIG. 7 is a block/flow diagram showing a system/method for executing Algorithm 2 in accordance with one illustrative embodiment.

Referring to FIG. 7, a block/flow diagram is illustratively shown in accordance with the present principles. The diagram provides Algorithm 2 for improving or modifying the candidate prefix graph structure to meet criteria. In block 302, a prefix graph G is input. G is a prefix graph for an adder used in the physical synthesis of FIG. 5. In block 304, a new adder output y is identified in a post-physical synthesis design that has a most negative slack (i.e., largest negative slack path in the prefix graph). In block 306, logic gates (nodes in the prefix graph) unique to a cone of the most negative slack path are removed. In block 308, alternate prefix graph structures for a logic cone of output y using techniques like branch and bound to determine an alternate path (S). In block 310, use a sub graph g∈S that gives a best timing after incremental physical synthesis. In block 312, a determination is made as to whether more adder outputs have been produced with negative slack.

If more are present, then the path returns to block 304 to continue processing. Otherwise, the analysis ends in block 314.

Suppose that a given logic cone containing critical paths with worst negative slack implements a bit slice in the prefix graph with MSB i and LSB j with level of level l. The branch-and-bound procedure described in Algorithm 2 of Table 3 can find several alternate candidate logic structures for the given logic cone with levels of logic less than or equal to l, stored in a list at the location indexed by i, j, l in the data structure nodeArray, i.e., nodeArray[i][j][l]. Each entry in the list contains a data structure with four fields—area, left, and right.

Area represents the incremental area cost for implementing the bit-slice [i:j], left and right point to the data-structure entries for the left and right sub-trees, respectively. The list of solutions at nodeArray[i][j][l] stored in the increasing order of the value in the area field. Given an n-bit prefix graph $G_n$, each node g that is not exclusively part of the logic cone to be restructured is initialized in nodeArray[i][j][l] with area=0 (lines 1-8 in Algorithm 2), representing the incremental cost for implementing the bit-slice [i:j]. In Procedure buildIncremental, if a solution for the bit-slice [i:j] already exists, then the minimum area solution is returned (lines 9-11 in Algorithm 2). Otherwise, the bit-slice [i:j] is split into two sub-problems [i:s] and [s+1:j] and buildIncremental is called on the two sub-problems (lines 12-14 in Algorithm 2). Whenever a solution is found, only the solutions within a window of delta of the minimum area solution are stored (lines 15-23 in Algorithm 2). Algorithm 2 may be thought of as pruning negative slack paths (and logic) from the prefix graph in favor of paths with better timing. However, it should be understood that the timing criteria may be combined with or replaced by other criteria, such as, e.g., fanout, power, area, etc.

TABLE 3

Pseudocode for Algorithm 2:

Algorithm 2 Branch-and-Bound Approach

```
// nodeArray [i] [j] [l] stores candidate solutions for lsb i and msb j
  with level l
 1:    for all nodes n = [i:j] in G_n do
 2:        Set data.area = 0;
 3:        Set data.left = NULL;
 4:        Set data.right = NULL;
 5:        Insert data into nodeArray [i] [j] [level(n)];
 6:    end for
 7:    //Given G_n construct solutions for lsb i and msb j with level l
 8:    Procedure buildIncremental(nodeArray, i, j, l)
 9:    if (nodeArray [i] [j] [l].size( ) > 0) then
10:        return min. area of nodeArray [i] [j] [l];
11:    end if
12:    for s = i; s <= j; ++s do
13:        left ← buildIncremental(nodeArray, i, s, l − 1);
14:        right ← buildIncremental(nodeArray, s + 1, j, l − 1);
15:        if (left == NULL || right == NULL) continue;
16:        Set data.area = left.area + right.area + 1;
17:        Set data.left = left;
18:        Set data.right = right;
19:        if (data.area > min. area of nodeArray [i] [j] [l] +
               delta) then
20:            delete data;
21:        else
22:            Insert data into nodeArray [i] [j] [level(n)];
23:        end if
24:    end for
25:    end Procedure
```

Referring to FIGS. 8A-8D, four sample prefix graph solutions generated by Algorithm 1 in accordance with the present principles are presented for an 8-bit adder with a logic level constraint of log(i) for output bit i. FIGS. 8A-8D plot level (ordinate) versus bit-index (abscissa). The following features/constraints are also shown. Bit width, total area (chip area), maximum level (Max level), maximum fanout (Max. Fanout), total wire length (Total WireL), maximum wire length (Max. WireL, total paths, total path length (Total PathL), maximum path fanout (Max. Path FO) and total path fanout (Total Path FO). Note that these generated candidates are compared in accordance with these criteria to select a best prefix graph or a prefix graph having a best combination of characteristics.

Figure 9A:
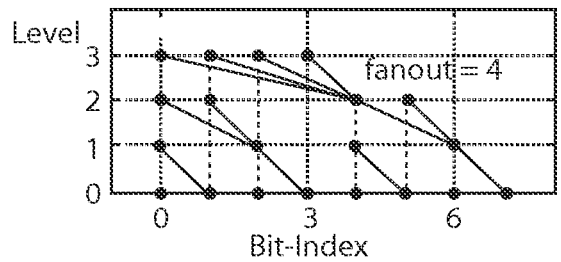
FIGS. 9A-9B show illustrative prefix graphs modified to improve performance using Algorithm 2 in accordance with one illustrative embodiment.
Figure 9B:
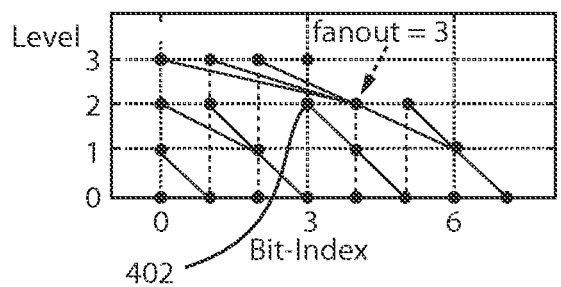

Referring to FIGS. 9A-9B, a sample prefix graph is shown before and after modification of the graph structure in accordance with Algorithm 2 in accordance with the present principles for an 8-bit adder with a logic level constraint of log(i) for output bit i. FIGS. 9A-9B plot level (ordinate) versus bit-index (abscissa). The following features/constraints are also shown. Bit width, total area (chip area), maximum level (Max level), maximum fanout (Max. Fanout), total wire length (Total WireL), maximum wire length (Max. WireL, total paths, total path length (Total PathL), maximum path fanout (Max. Path FO) and total path fanout (Total Path FO). FIG. 9B shows an effect of adding a node 402 to reduce the fanout to 3 from a fanout of 4 in FIG. 9A. Note other modifications are possible and contemplated.

Figure 10:
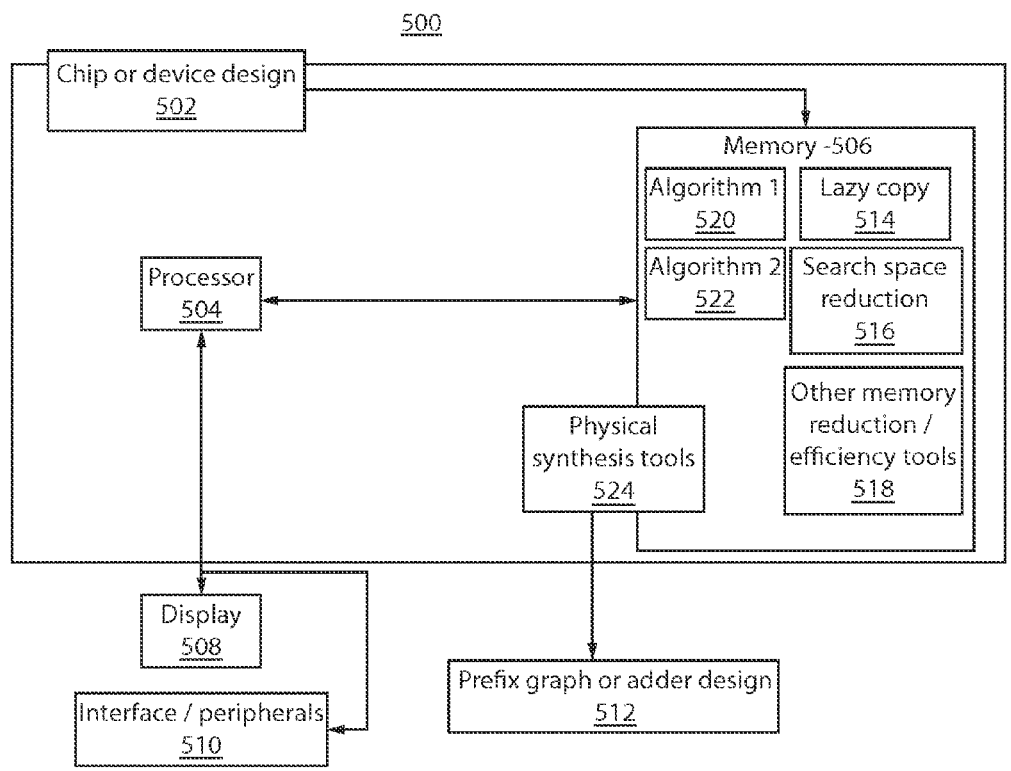
FIG. 10 is a block/flow diagram showing a system/method for determining or designing prefix graphs and binary adders in accordance with one illustrative embodiment.

Referring to FIG. 10, a system 500 for determining a parallel prefix graph for a binary adder is shown in accordance with one illustrative embodiment. System 500 includes a computer system having a processor(s) 504 and a memory device or devices 506. The system 500 may include a display 508 and an interface 510. The interface 510 may include input/output peripheral devices and the like to enable interaction with the system 500. The peripheral devices may include a keyboard, a mouse, a joystick, a touch screen function, microphone, speakers, etc. The system 500 may be connected to other computers or to a local or global network. In one embodiment, the system 500 may receive or store a semiconductor device plan or a proposed device design in input block 502. The device design may include an HDL, VHDL, Verilog or other computer aided design specification. In particular, the design includes a processing device, such as an adder and in particular a parallel prefix adder. The system 500 executes the steps and features of FIGS. 5, 6 and/or 7 including Algorithm 1 520 and Algorithm 2 522.

In addition, physical synthesis tools 524 may be stored in the memory 506 (e.g., as digital models for simulation) or may include hardware prototypes. The memory 506 also stores methods to make processing the present embodiments more memory efficient. These may include using a lazy copy technique 514, and search space reduction techniques 516. Search space reduction techniques 516 may include, for example, level pruning, size pruning, repeatability pruning, prefix structure restriction, etc. Other memory reduction and efficiency techniques 518 may also be employed.

Lazy Copy 514: In object-oriented programming, lazy copy (a copy-on-write strategy) is a combination of deep copy and shallow copy. When an object is copied initially, a shallow copy (fast) is used and then the deep copy is performed when it is absolutely necessary (for example, modifying a shared object). This notion (Copy as late as possible) is used in the present implementation in a different way. In a pre-order traversal of a typical recursion tree implementation, when we move from a root node to its left subtree, a copy of the root node is stored to traverse the right subtree at a later stage. In the present approach, we copy the sequence only when we get a valid prefix graph, otherwise we keep on modifying the sequence. For example, we do not store the sequences ('312', '3312') in FIG. 4, i.e. when we move to the left subtree of a node in the recursion tree 50; we insert the index and delete it while coming back to the node in the pre-order traversal, and store only the leaf nodes. Table 3 shows a comparison of number (#) of operations for FIG. 4 with and without using lazy copy. This improves the run time significantly and memory usage slightly. As the depth of the recursion tree increases, this technique becomes more and more useful. However, the insertion and deletion operations of an element in a list with the element's position (iterator) being an O(1) operation, these operations do not degrade the run time.

TABLE

| | # of operations | |
|---|---|---|
| Operation | w/o lazy copy | with lazy copy |
| Copy | 5 | 3 |
| Delete | 2 | 0 |

Search Space Reduction 516: As the complexity of the exhaustive approach is very high, it is not feasible and relevant to generate all possible prefix graphs. Rather, we are interested in generating potential candidate solutions to optimize performance/area. At the logic synthesis level, these objectives translate to minimizing the number of logic levels and number of prefix nodes in the prefix graph. The following search space reduction techniques may be employed to scale this approach.

Level Pruning:

The performance of an adder depends directly on the number of logic levels of the prefix graph. The present approach intends to minimize the number of prefix nodes with given bitwidth and logic level (L) constraints. In Algorithm 1, we keep track of the levels of each prefix node and if the level of the inserted node (or index) becomes greater than L, the flow returns from the recursive procedure. This is the normal level pruning approach to minimize the number of prefix nodes as much as possible. As we are focused to build a high-performance adder, we mainly concentrate on prefix graphs with minimum number of logic levels ($\lceil \log N \rceil$). To facilitate this, we perform aggressive level pruning which signifies each output bit m is constrained to be at level $\lceil \log m \rceil$. Other constraints may be employed as well.

Size Pruning (Dynamic):

We can construct the set $G_{n+1}$ from $G_n$. While doing this, we prune the solution space based on size (# of prefix nodes) of elements in $G_n$. Let $s_{min}$ be the size of the minimum sized prefix graph(s) of $G_n$. Then, we prune the solutions (g) for which size(g) $s_{min}+\Delta$. For example, suppose the sizes of the solutions in $G_n$=[9 10 11] and $\Delta$=2. To construct $G_{n+1}$, we select the graphs in increasing order of sizes and build the elements of $G_{n+1}$. Let the graphs with sizes $X_1$=[12 13 14 15], $X_2$=[11 14] and $X_3$=[13 16] respectively be constructed from the graphs of sizes 9, 10, 11 in $G_n$. In this case, the minimum size solution is the solution with size 11, and so the sizes of the solutions stored in $G_{n+1}$=[[12 13], [11], [13]]. This pruning is done to choose the potential elements of $G_{n+1}$, which can give a minimum size solution for the higher bits.

However, pruning the superfluous solutions after constructing the whole set $G_{n+1}$ can cause peak memory overshoot. So we employ the strategy "Delete as early as possible", i.e., we generate solutions on the basis of current minimum size $s_{min}^{current}$. Let us take the same example to illustrate this. In $X_1$, $s_{min}^{current}$=12 and so we do not construct the graph with size 15, as 15>12+2. Similarly, when we get the solution with size 11 in $X_2$, we delete the graph with size 14 from $X_1$ and do not construct the graph with size 16 in $X_3$. Indeed, whenever the size of the list/sequence in Algorithm 1 exceeds $s_{min}^{current}$ by $\Delta$+1, the flow is returned from RP. Apart from reducing the peak memory usage, this dynamic pruning of solutions helps in improving run time by reducing copy/delete operations.

Repeatibility Pruning:

The sequence (in the present notation) denoting a prefix graph can have consecutive indices. For example, '33312' in FIG. 4 has 3 consecutive 3's in the sequence. We restrict this repetition by a parameter R. If this parameter is set to 2, then we modify the exhaustive algorithm not to generate the solution '33312'. We have observed that R=1 does not degrade the solution quality, but restricts the search space to a great extent at the early stage. For example, '3312' is a better solution than '33312' both in terms of logic level and size.

Figure 11:
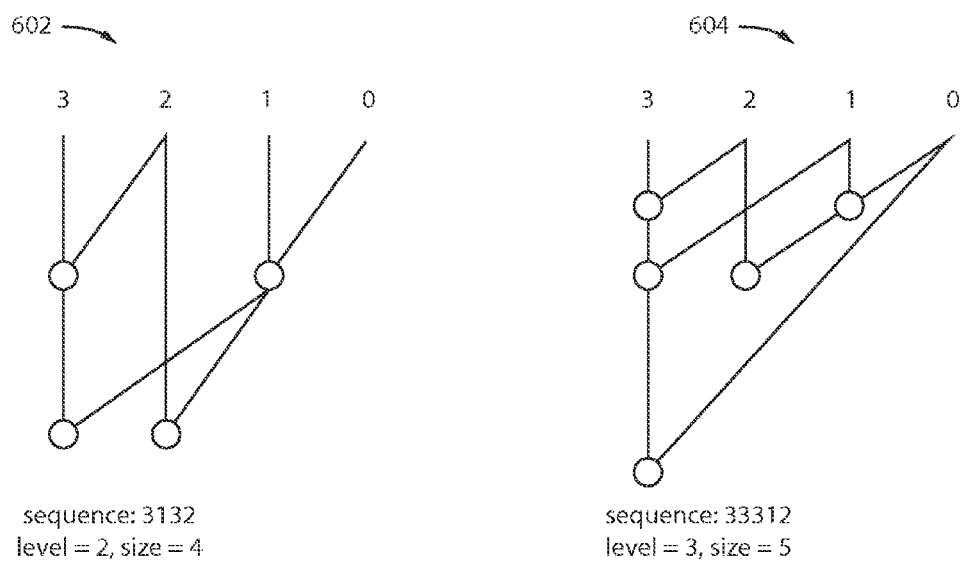
FIG. 11 shows a comparison of prefix graphs for illustrating a better graph structure in accordance with the present principles.

Referring to FIG. 11, two prefix graphs 602 and 604 are shown. The prefix graph 602 with the solution '3312' is a better solution than graph 604 with the solution '33312' in terms of logic level and size. The graph 604 can be eliminated as a candidate, thus reducing memory storage and processing time for further consideration of the inferior solution.

Prefix Structure Restriction:

This is a special restriction in prefix graph structure for $2^n$ bit adders with n logic levels. For example, if we need to construct an 8 bit adder with logic level 3, the only way to realize the MSB using the same notation as Eqn. (2) is given by $$y_7 = ((x_7 o x_6) o (x_5 o x_4)) o ((x_3 o x_2) o (x_1 o x_0)) \qquad (9)$$

So 7 nodes or alternatively ($2^n$−1) prefix nodes are fixed for the $2^n$ bit adder with n level. We impose this restriction in one implementation for generating the sequence of indices, which helps in improving the run time significantly.

RESULTS: We have implemented the exhaustive approach in C++ and executed on a Linux machine. At first, we present our results at the logic synthesis (technology independent) level. As the dynamic programming (DP) based area-heuristic approach has achieved better results compared to the other relevant works, we have implemented this approach as well to compare with our experimental results. Table 4 presents the comparison of number of prefix nodes for adders with different bit-width with the logN level constraint. In this case, the input profile is uniform, i.e. the arrival times of all input bits are assumed to be same. The result of non-uniform profile for a 32 bit adder is shown in Table 5. In these examples, the needed arrival level for each output bit is set at 9, and the arrival level for each input bit is randomly generated in the range 0-4. We can see that the approach in accordance with the present principles (Exhaustive Approach) out-performs the DP approach (Area Heuristic) in both cases. It takes about 3 sec to generate 64 bit prefix graphs with level constraint 6, which can be considered sufficient.

TABLE 4

Comparison of # of Prefix Nodes for logN level

| # of bits | Exhaustive | Area Heuristic |
|---|---|---|
| 16 | 31 | 31 |
| 24 | 45 | 46 |
| 32 | 74 | 74 |
| 48 | 105 | 106 |
| 64 | 167 | 169 |
| 128 | 364 | 375 |

TABLE 5

Result for non-uniform input profile for 32 bit adder

| Profile | Exhaustive | Area Heuristic |
|---|---|---|
| A | 55 | 56 |
| B | 55 | 58 |
| C | 56 | 60 |
| D | 54 | 59 |
| E | 53 | 59 |
| F | 55 | 59 |
| G | 53 | 57 |

As mentioned earlier, the existing approaches are not flexible in restricting parameters like fanout, which is one important parameter to optimize post-placement design performance. We have integrated this Exhaustive Approach to a placement driven synthesis tool and obtained the timing data after placement for various potential optimum solutions generated by our approach.

Figure 12:
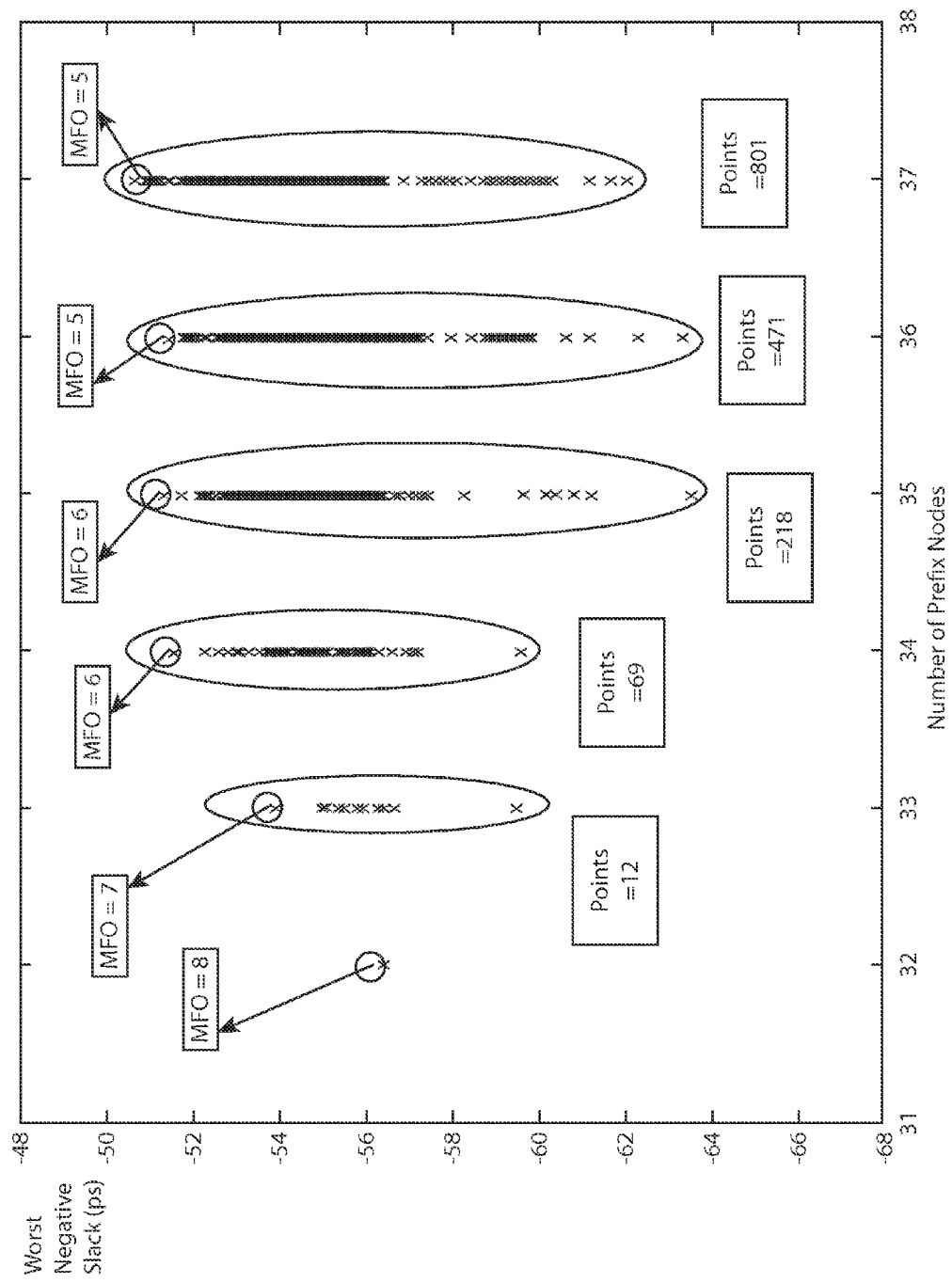
FIG. 12 shows worst negative slack (WNS) versus number of prefix nodes for a 16 bit adder.

Referring to FIG. 12, a worst negative slack (WNS) is plotted against the size of a prefix graph for 16 bit adders. We can see that the prefix graphs of higher node count and smaller maximum fanout (MFO) are better for timing. Next, we run our approach with fan-out restrictions. A known Kogge-Stone (KS) adder is the most effective adder structure in constraining fanout. An important property of this structure is that maximum fanout (MFO) of an n bit adder is less than log n, and the fan-out for prefix nodes at logic level log n−1 is restricted to 2. This renders the Kogge Stone adder to be one of the fastest adders. Table 6 compares our approach (exhaustive) for fanout restriction with Kogge Stone adders in terms of number of prefix nodes. It can be noted that we have achieved a better result than Kogge Stone adders for 8, 16, 32 bits even with a fanout restriction of 2 for all prefix nodes.

TABLE 6

Comparison with Kogge Stone Adder

| # of bits | Exhaustive (MFO = 2) | Exhaustive (MFO = logN) | Kogge Stone |
|---|---|---|---|
| 8 | 14 | 13 | 17 |
| 16 | 42 | 35 | 49 |
| 32 | 114 | 89 | 129 |
| 64 | 290 | 238 | 321 |

We also ran a placement driven synthesis (PDS) tool for the minimum size solutions of 8, 16, 32, 64 bit adders provided by the exhaustive approach. We present the various metrics like area, WNS, wire length, FOM (Figure of merit) after placement in Table 7 for the solution having best WNS. FOM here signifies the sum of the total negative slacks at the timing end-points. We have also compared this result with fast (BF), fastest adders (BFT) internal to the tool, Kogge Stone (KS) adders and another state-of-the art method BB.

TABLE 7

Different metrics of PDS flow for adders

| n | Approach | Area | WNS | Wire length | FOM |
|---|---|---|---|---|---|
| 8 | BF | 828 | −71.688 | 3996 | −527 |
|  | BFT | 1142 | −60.34 | 5771 | −461 |
|  | KS | 1146 | −48.850 | 5889 | −391 |
|  | BB | 853 | −47.384 | 3761 | −371 |
|  | EXH | 871 | −43.7266 | 3804 | −351 |
| 16 | BF | 2147 | −75.659 | 12712 | −1156 |
|  | BFT | 2718 | −69.208 | 17075 | −1102 |
|  | KS | 2101 | −55.456 | 13604 | −878 |
|  | BB | 1980 | −56.221 | 9776 | −852 |
|  | EXH | 2152 | −50.684 | 11102 | −812 |
| 32 | BF | 4292 | −107.523 | 26397 | −3072 |
|  | BFT | 6618 | −79.605 | 44717 | −2515 |
|  | KS | 5495 | −65.542 | 39474 | −2082 |
|  | BB | 4637 | −68.597 | 24994 | −2136 |
|  | EXH | 4692 | −64.932 | 24683 | −2074 |
| 64 | BF | 9832 | −120.315 | 59402 | −6931 |
|  | BFT | 16636 | −97.361 | 145901 | −6125 |
|  | KS | 13389 | −84.473 | 120600 | −5181 |
|  | BB | 10275 | −84.092 | 63733 | −5280 |
|  | EXH | 10905 | −89.605 | 71054 | −5709 |
|  | CT | 10048 | −83.812 | 60450 | −5230 |

Figure 13:
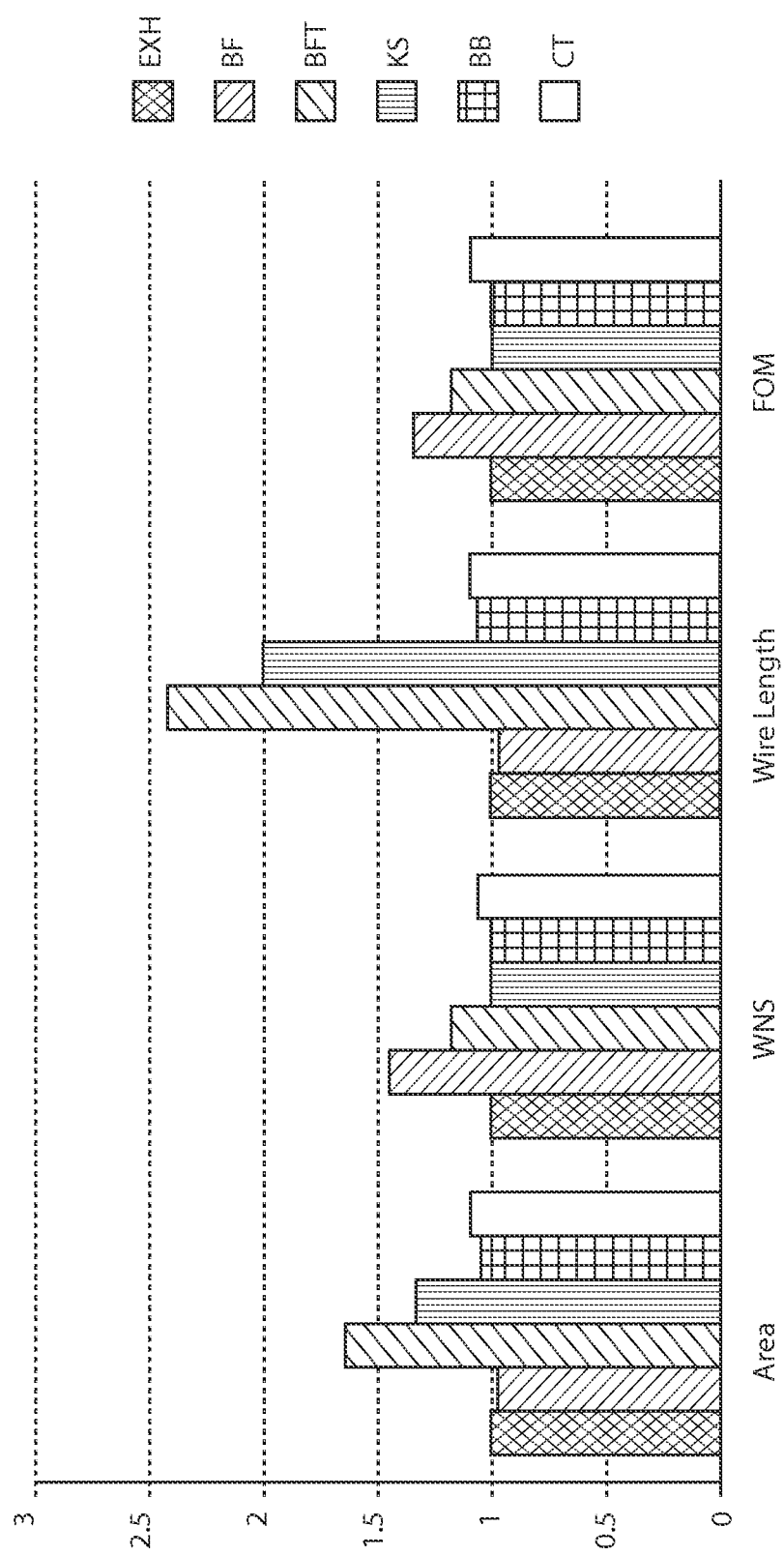
FIG. 13 is a bar chart showing metrics to compare different design approaches for a 64 bit adder.

Referring to FIG. 13, a bar chart plots different metrics for various approaches, which are graphed for comparison. We can see that exhaustive approach (EXH) outperforms the BF, BFT in most of the metrics. BF is better than EXH in terms of area, but EXH excels in all other metrics (WNS, wire length, FOM). In comparison with KS adders, EXH is better in area, wire length and comparable or slightly improves in timing. When compared to the BB method, there is some area overhead in the EXH approach (except 64 bit) but EXH performs a little better in timing. Even, the EXH approach beats the custom (CT) design of 64 bit adders in all metrics.

The exhaustive approach is presented to generate parallel prefix graphs for high performance adders. The complexity of the problem is exponential with the number of bits; however, we have adopted efficient pruning strategies and implementation techniques to scale this approach. The results both at the technology-independent level and after technology mapping provide improvement over existing algorithms, and provide more flexibility in the automated synthesis of parallel prefix structures. The present approach even yields better area and better timing than even a custom design of a 64 bit adder. As our approach could generate a set of optimum prefix graph structures for high performance adders of given bit-width, a suitable machine learning technique can be developed to map the metrics (level, size, fanout distribution of the prefix graphs) at the logic synthesis level to post-placement area/timing.

Having described preferred embodiments for automated synthesis of high-performance two operand binary parallel prefix adders (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer readable non-transitory storage medium comprising a computer readable program for automated synthesis of a parallel prefix device, wherein the computer readable program when executed on a computer causes the computer to perform the steps of:

determining structural constraints for a given parallel prefix device;

generating a plurality of candidate prefix graphs for the parallel prefix device by performing a search of possible prefix graphs meeting the constraints;

performing physical synthesis of each of the plurality of candidate prefix graphs to generate performance information for each candidate prefix graph; and determining one or more of the plurality of candidate prefix graphs that meet performance criteria for incorporation into the parallel prefix device.

2. The computer readable storage medium as recited in claim 1, further comprising: modifying a prefix graph structure to improve performance.

3. The computer readable storage medium as recited in claim 2, wherein modifying includes:

identifying a new adder output to a largest negative slack path on a candidate prefix graph;

removing gates unique to a fanout cone associated with the new adder output;

determining an alternate prefix graph structure for the cone of the new adder output;

determining a best value for a subgraph of the alternate prefix graph structure after incremental physical synthesis; and determining whether more adder outputs exist with negative slack to determine if the subgraph is to be selected.

4. The computer readable storage medium as recited in claim 3, wherein determining a best value includes determining a best timing.

5. The computer readable storage medium as recited in claim 3, wherein determining whether more adder outputs exist includes if new adder outputs exist returning to the step of identifying a new adder output.

6. The computer readable storage medium as recited in claim 1, wherein generating a plurality of candidate prefix graphs includes:

generating a set of n-bit prefix graph solutions P(i), where i is a counter, from each graph in P(n−1) using a recursive method; and stopping when i=n.

7. The computer readable storage medium as recited in claim 6, wherein the recursive method includes a recursive tree.

8. The computer readable storage medium as recited in claim 6, wherein generating a set of n-bit prefix graph solutions P(i) includes:

representing prefix graphs as a list of integers, where each node has at least one integer in the list equal to the most significant bit and a node i, j has bit i, as a most significant bit and bit j as a least significant bit; and listing the nodes in topographical order.

9. The computer readable storage medium as recited in claim 1, wherein generating a plurality of candidate prefix graphs includes minimizing one or more objective functions to optimize parameters in the candidate prefix graphs.

10. The computer readable storage medium as recited in claim 9, wherein the parameters include at least one of size of the candidate prefix graph, fanout, level, negative slack, chip area and wire length.

11. The computer readable storage medium as recited in claim 1, wherein the parallel prefix device includes an adder implemented on an integrated circuit.

12. A computer readable non-transitory storage medium comprising a computer readable program for automated synthesis of a two operand binary parallel prefix adder, wherein the computer readable program when executed on a computer causes the computer to perform the steps of:

determining structural constraints for a given adder device input from a computer storage media;

generating a plurality of candidate prefix graphs for the adder device by performing a search of possible prefix graphs meeting the constraints by generating a set of n-bit prefix graph solutions P(i), where i is a counter, from each graph in P(n−1) using a recursive method until i=n is reached;

performing physical synthesis of each of the plurality of candidate prefix graphs to generate performance information for each candidate prefix graph;

determining one or more of the plurality of candidate prefix graphs that meet performance criteria for incorporation into the adder device; and if the performance criteria is not met, modifying a prefix graph structure to improve the performance.

13. The computer readable storage medium as recited in claim 12, wherein modifying includes:

identifying a new adder output to a largest negative slack path on a candidate prefix graph;

removing gates unique to a fanout cone associated with the new adder output;

determining an alternate prefix graph structure for the cone of the new adder output;

determining a best value for a subgraph of the alternate prefix graph structure after incremental physical synthesis; and determining whether more adder outputs exist with negative slack to determine if the subgraph is to be selected.

14. The computer readable storage medium as recited in claim 13, wherein determining a best value includes determining a best timing.

15. The computer readable storage medium as recited in claim 13, wherein determining whether more adder outputs exist includes if new adder outputs exist returning to the step of identifying a new adder output.

16. The computer readable storage medium as recited in claim 12, wherein the recursive method includes a recursive tree.

17. The computer readable storage medium as recited in claim 12, wherein generating a set of n-bit prefix graph solutions P(i) includes:

representing prefix graphs as a list of integers, where each node has at least one integer in the list equal to the most significant bit and a node i, j has bit i, as a most significant bit and bit j as a least significant bit; and listing the nodes in topographical order.

18. The computer readable storage medium as recited in claim 12, wherein generating a plurality of candidate prefix graphs includes minimizing one or more objective functions to optimize parameters in the candidate prefix graphs.

19. The computer readable storage medium as recited in claim 18, wherein the parameters include at least one of size of the candidate prefix graph, fanout, level, negative slack, chip area and wire length.

20. The computer readable storage medium as recited in claim 12, wherein the adder device is included in an integrated circuit.

21. A parallel prefix device, comprising:

summing logic gates; and a parallel prefix circuit configured to determine carry bits, the prefix circuit being selected in accordance with a prefix graph, the prefix graph including nodes and connections having a configuration selected by generating a plurality of candidate prefix graphs for the parallel prefix circuit by performing a search of possible prefix graphs meeting structural constraints and performing physical synthesis of each of the plurality of candidate prefix graphs to generate performance information for each candidate prefix graph such that a best performing candidate prefix graph that meets performance criteria is incorporated into the parallel prefix device.

22. The device as recited in claim 21, wherein the device includes an adder.

23. The device as recited in claim 21, wherein the performance criteria includes one of timing, area, power consumption, size of the prefix graph, wire length and/or fanout.

24. The device as recited in claim 21, wherein the device is included in an integrated circuit.

* * * * *